(12) United States Patent
Fan et al.

(10) Patent No.: US 12,326,665 B2
(45) Date of Patent: Jun. 10, 2025

(54) QUANTUM META-DEVICE FOR ULTRASENSITIVE DISPLACEMENT METROLOGY

(71) Applicant: City University of Hong Kong, Kowloon (HK)

(72) Inventors: Yubin Fan, Kowloon (HK); Mu Ku Chen, Kowloon (HK); Din Ping Tsai, Kowloon (HK)

(73) Assignee: City University of Hong Kong, Kowloon (HK)

( * ) Notice: Subject to any disclaimer, the term of this patent is extended or adjusted under 35 U.S.C. 154(b) by 133 days.

(21) Appl. No.: 18/490,929

(22) Filed: Oct. 20, 2023

(65) Prior Publication Data
US 2024/0402616 A1   Dec. 5, 2024

(30) Foreign Application Priority Data

Jun. 2, 2023   (CN) .......................... 202310648823.4

(51) Int. Cl.
*G03F 7/00* (2006.01)
*G01J 1/16* (2006.01)
(Continued)

(52) U.S. Cl.
CPC ........ *G03F 7/70633* (2013.01); *G01J 1/1626* (2013.01); *G02F 1/3526* (2013.01);
(Continued)

(58) Field of Classification Search
CPC . G01J 1/1626; G02F 1/3526; G03F 7/706847
See application file for complete search history.

(56) References Cited

U.S. PATENT DOCUMENTS

2004/0036877 A1*  2/2004  Sergienko ............ G01N 21/211
                                                           356/369
2007/0263197 A1   11/2007  Luttikhuis et al.

FOREIGN PATENT DOCUMENTS

| CN | 105674889 | 6/2016 |
| CN | 108139888 | 6/2018 |
| CN | 114166359 | 3/2022 |

OTHER PUBLICATIONS

Zang H, Xi Z, Zhang Z, et al. Ultrasensitive and long-range transverse displacement metrology with polarization-encoded metasurface[J]. Science Advances, 2022, 8(41): eadd1973.
(Continued)

*Primary Examiner* — Thanh Luu
(74) *Attorney, Agent, or Firm* — Renner, Kenner, Greive, Bobak, Taylor & Weber

(57) ABSTRACT

Displacement measurement systems, measurement methods and EUV lithography machines for quantum meta-structure elements are disclosed, which include: an entangled state light source generator, a meta-device, a collimating lens, a polarizing beam splitter, and a computing section. Left-rotation photon and the right-rotation photon are projected to the polarizing beam splitter, and the correlation between output ports of two polarizing beam splitters is counted for reading to measure the displacement of the meta-device element. The displacement of the meta-structure element is measured in a manner that realizes the correlation between the left-rotation photons and the right-rotation photons.

19 Claims, 5 Drawing Sheets

(51) Int. Cl.
*G01J 1/44* (2006.01)
*G02F 1/35* (2006.01)

(52) U.S. Cl.
CPC .. *G03F 7/706847* (2023.05); *G03F 7/706849* (2023.05); *G03F 7/706851* (2023.05); *G01J 2001/442* (2013.01); *G03F 7/706831* (2023.05)

(56) References Cited

OTHER PUBLICATIONS

Georgi P, Massaro M, Luo K H, et al. Metasurface interferometry toward quantum sensors[J]. Light: Science & Applications, 2019, 8(1): 1-7.

* cited by examiner

QUANTUM META-DEVICE FOR ULTRASENSITIVE DISPLACEMENT METROLOGY

FIELD OF INVENTION

This invention relates to the field of displacement metrology, and in particular to displacement measurement systems, measurement methods and a EUV (extreme ultraviolet) lithography machines for quantum meta-device elements.

BACKGROUND OF INVENTION

Currently, in high-precision semiconductor processing scenarios such as high-precision displacement stage, electron beam exposure, and deep ultraviolet exposure, direct electronic sensors or direct mechanical sampling methods, including visual observation and measurement by using measurement tools, are not able to sample displacement of the semiconductor due to the fact that the displacement in high-precision semiconductor scenarios may be only a few micrometers or even a few nanometers. Therefore, some lithography equipment is used to measure the displacement of the semiconductor in a correlated way, i.e., with simultaneous displacement of measured object and measurement element, so that a displacement of the measured object may be obtained via the measurement element.

A meta-device element is a measurement element used in semiconductor displacement metrology to realize fine displacement measurement. By using a metasurface, it is possible for the meta-device element to accurately manipulate phase and polarization of the incident light. The quantum meta-device element for ultrasensitive displacement measurement, which is based on the principle of beam splitting of circularly polarized light, is able to accurately regulate the output of a pair of circularly polarized light. The displacement of the meta-device element is then determined by the phase of the circularly polarized light to obtain the displacement of the measured object.

However, conventional displacement measurement techniques based on the meta-device element use classical light, and in addition, the structure of the measurement system is too redundant in conventional displacement measurement techniques.

SUMMARY OF INVENTION

Accordingly, the present invention in one aspect provides a displacement measurement system, which contains an entangled state light source generator adapted to emit a linearly-polarized photon pair, a meta-device element adapted to receive the linearly-polarized photon pair and converts the same to a circularly-polarized photon pair; a first polarization beam splitter adapted to split one or both ways of the circularly-polarized photon pair into a left-handed rotational photon and a right-handed rotational photon, and to output the left-handed rotational photon and the right-handed rotational photon via a first port and a second port of the first polarization beam splitter respectively; and a computing section adapted to compute a correlated count reading between the first and second ports of the first polarization beam splitter, and to determine a displacement of the meta-device element. The linearly-polarized photon pair outputted from the entangled state light source generator is an entangled photon pair.

In some embodiments, the system further include a collimating lens positioned, in a direction of propagation of the linearly-polarized photon pair, after the meta-device element. The collimating lens is adapted to collimate the circularly-polarized photon pair.

In some embodiments, the computing section further includes a first single photon detector, a second single photon detector, and a correlation counter. The first single photon detector is adapted to receive the left-handed rotational photon from the first port of the first polarization beam splitter. The second single photon detector is adapted to receive the right-handed rotational photon from the second port of the first polarization beam splitter. The correlation counter is adapted to compute the correlated count reading between the first and second ports of the first polarization beam splitter.

In some embodiments, the system further include a photon converging section positioned, in a direction of propagation of the linearly-polarized photon pair, after the meta-device element. The photon converging section is adapted to converge individual photons into photon pairs.

In some embodiments, the photon converging section is further adapted to convert the circularly-polarized photon pair to a further linearly-polarized photon pair.

In some embodiments, the system further include a reflection section positioned, in a direction of propagation of the further linearly-polarized photon pair, after the photon converging section. The reflection section is adapted to reflect the further linearly-polarized photon pair along a direction of reflection to the photon converging section and in turn to the meta-device element.

In some embodiments, the reflection section further includes a spatial filter adapted to filter interference signals in the further linearly-polarized photon pair.

In some embodiments, the system further include a beam splitter mirror positioned between the entangled state light source generator and the meta-device element. The beam splitter mirror is adapted to transmit the linearly-polarized photon pair generated by the entangled state light source generator to the meta-device element, and also to reflect the further linearly-polarized photon pair received from the meta-device element to the first polarizing beam splitter.

In some embodiments, the entangled state light source generator includes a continuous-light laser, an entangled photon pair converter, and a second polarizing beam splitter. The entangled photon pair converter is adapted to convert a linearly-polarized light received from the continuous-light laser into the linearly-polarized photon pair. The second polarizing beam splitter is adapted to reflect and project a left-handed rotational photon and a right-handed rotational photon in the linearly-polarized photon pair.

In some embodiments, the entangled photon pair converter is a BBO (beta-BaB$_2$O$_4$) crystal.

In some embodiments, the entangled state light source generator further includes an angle adjusting section which is adapted to adjust an exit angle of left-handed rotational light outputted from the entangled photon pair converter, and to reflect it to the second polarizing beam splitter.

In some embodiments, the entangled state light source generator further contains a time delay adjusting section which is adapted to adjust a time delay of right-handed rotational light outputted from the entangled photon pair converter, and to reflect it to the second polarizing beam splitter.

According to another aspect of the invention, there is provided a method of conducting a displacement measurement. The method includes the steps of generating continuously a plurality of linearly-polarized photon pairs; converting, using a meta-device element, one of the plurality of linearly-polarized photon pairs to a circularly-polarized photon pair; attaching a phase to the circularly-polarized photon pair; the phase derived from a displacement of the meta-device element; splitting one or both ways of the circularly-polarized photon pair into a left-handed rotational photon and a right-handed rotational photon; outputting the left-handed rotational photon and the right-handed rotational photon via a first port and a second port of a polarization beam splitter respectively; and computing a correlated count reading between the first and second ports of the polarization beam splitter in order to determine the displacement of the meta-device element.

In some embodiments, the method further includes a step of collimating the circularly-polarized photon pair before the step of splitting one or both ways of the circularly-polarized photon pair into the left-handed rotational photon and the right-handed rotational photon.

In some embodiments, the method further includes a step of converging a plurality of individual protons obtained from the splitting step into photon pairs.

In some embodiments, the method further includes a step of converting the circularly-polarized photon pair to a further linearly-polarized photon pair.

In some embodiments, the method further includes a step of reflecting the further linearly-polarized photon pair back to the meta-device element so that an additional phase is attached to the further linearly-polarized photon pair.

In some embodiments, the computing step further includes receiving the left-handed rotational photon by a first single photon detector of the computing section; in response to the left-handed rotational photon being received, generating a first high voltage level and sending it to a correlation counter of the computing section; receiving the right-handed rotational photon by a second single photon detector of the computing section; in response to the right-handed rotational photon being received, generating a second high voltage level and sending it to the correlation counter; and incrementing the correlation counter by one if both the first and second high voltage levels were received in a same time window.

In some embodiments, the method further includes a step of determining the displacement of the meta-device element based on a correlated count reading by the correlation counter after an exposure time has passed; the exposure time comprising multiple said time windows.

One can see that in exemplary embodiments of the invention, a number of linearly-polarized photon pairs can be continuously generated and sent by the entangled state light source generator, and then the linearly-polarized photon pairs are passed through the meta-device element and attached with a phase resulted from displacement of the meta-device element, resulting in circularly-polarized photon pairs. Then, after splitting one of the two photons in each circularly polarized photon pair into a left-handed rotational photon or a right-handed rotational photon, the rotational photon is sent to a computing section which carries out a correlation calculation and as a result, the displacement of the meta-device element can be measured. The displacement of the meta-device element can be obtained by using a displacement measurement system with only the entangled state light source generator, the meta-device element, the collimating lens, the polarizing beam splitter, and the computing section. In this way, the size of the displacement measuring system can be scaled down, the redundancy of the system can be reduced, and the resolution can be attained similar to that by prior art.

BRIEF DESCRIPTION OF FIGURES

The foregoing and further features of the present invention will be apparent from the following description of embodiments which are provided by way of example only in connection with the accompanying figures, of which:

FIG. 1b is a three-dimensional schematic diagram of the displacement measurement system of FIG. 1a.

DETAILED DESCRIPTION OF PREFERRED EMBODIMENTS

Figure 1A:
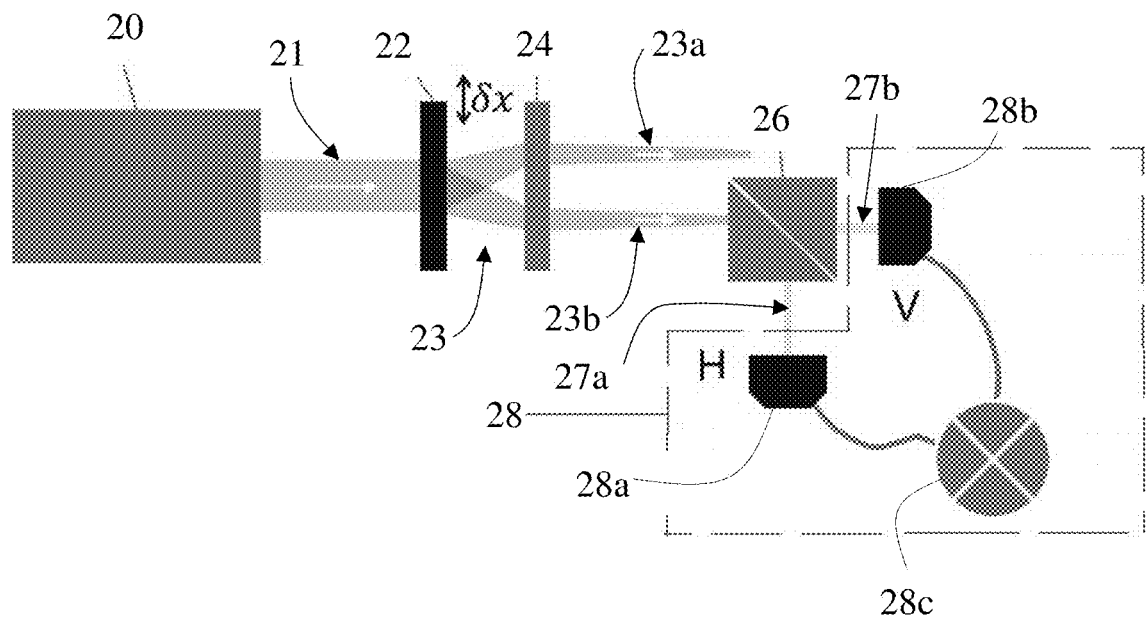
FIG. 1a is a two-dimensional schematic diagram of a displacement measurement system for a quantum meta-device element according to a first embodiment of the invention.
Figure 1B:
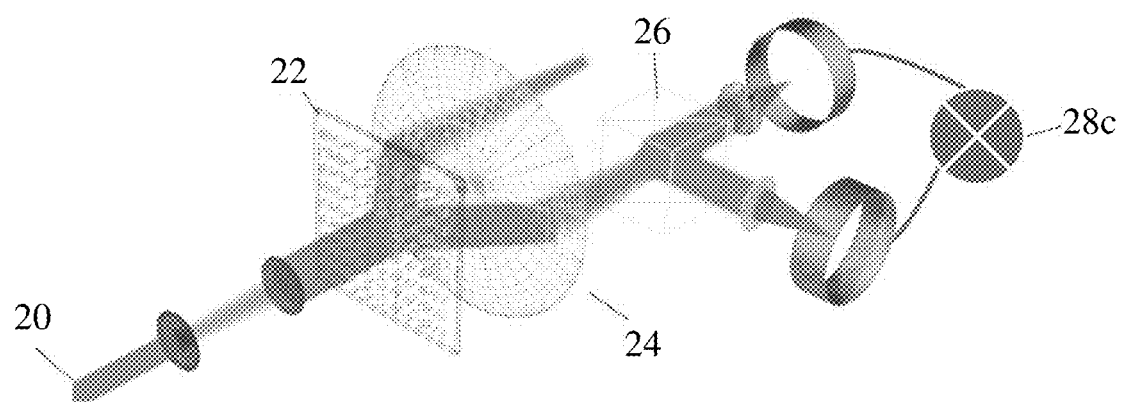

FIGS. 1a and 1b illustrate a displacement measurement system for a quantum meta-device element according to a first embodiment of the invention. The system includes an entangled state light source generator 20, a meta-device element 22, a collimating lens 24, a polarizing beam splitter 26, and a computing section 28. The entangled state light source generator 20 is adapted to continuously generate and send a number of linearly-polarized photon pairs. The entangled state light source generator 20 is also referred as a NOON source in the embodiment. As skilled person would understand, in quantum optics a NOON state or NOON state is a quantum-mechanical many-body entangled state: which represents a superposition of N particles in mode a with zero particles in mode b, and vice versa.

Output of the entangled state light source generator 20 goes to the meta-device element 22. The meta-device element 22 is adapted to modulate the linearly-polarized photon pairs into circularly-polarized photon pairs, so that the latter are attached with a phase resulted from displacement of the meta-device element 22. As will be mentioned in more details below, it is the purpose of measuring even tiny displacement of the meta-device element 22 by the displacement measurement system. In a direction of propagation of the linearly-polarized photon pairs, after the meta-device element there is a collimating lens 24 which is adapted to collimate the circularly-polarized photon pairs, and transmitting one way of circularly-polarized photons of the circularly-polarized photon pairs to the polarizing beam splitter 26 that follows the collimating lens 24. The polarization beam splitter 26 is adapted to split the one way of circularly polarized photons with attached phase into left-handed rotational photons 27a and right-handed rotational photons 27b, and emit them to the computing section 28. The computing section 28 is adapted to calculate, during an exposure time including a number of time windows, correlation count reading between two output ports (not shown) of the polarizing beam splitter 26 after the left-handed rotational photons 27a and the right-handed rotational photons 27b are projected to the polarizing beam splitter 26 during each time window, in order to measure the displacement of the meta-device element 22.

As shown in FIG. 1a, the computing section 28 includes a first single photon detector 28a, a second single photon detector 28b and a correlation counter 28c. The correlation counter 28c is connected to the first single photon detector 28a and said second single photon detector 28b, respectively. The first single photon detector 28a is adapted to receive the left-handed rotational photons 27a and the second single photon detector 28b is adapted to receive the right-handed rotational photons 27b. When the first single photon detector 28a receives a left-handed rotational photon 27a, a high voltage level is generated and sent to the correlation counter 28c. When the second single photon detector 28b receives a right-handed rotational photon 27b, a high voltage level is generated and sent to the correlation counter 28c. The correlation counter 28c is adapted to perform a comparison in the same time window that if both a high voltage level is received from the first single photon detector 28a and a high voltage level is received from the second single photon detector 28b, then the correlation counter 28c increments the correlation count by one. The correlation counter 28c takes the increased and completed correlation count after the completion of the exposure as the correlation count reading for this displacement measurement. The exposure is completed when an exposure time has passed, where the exposure time contains multiple time windows as mentioned above.

Figure 2:
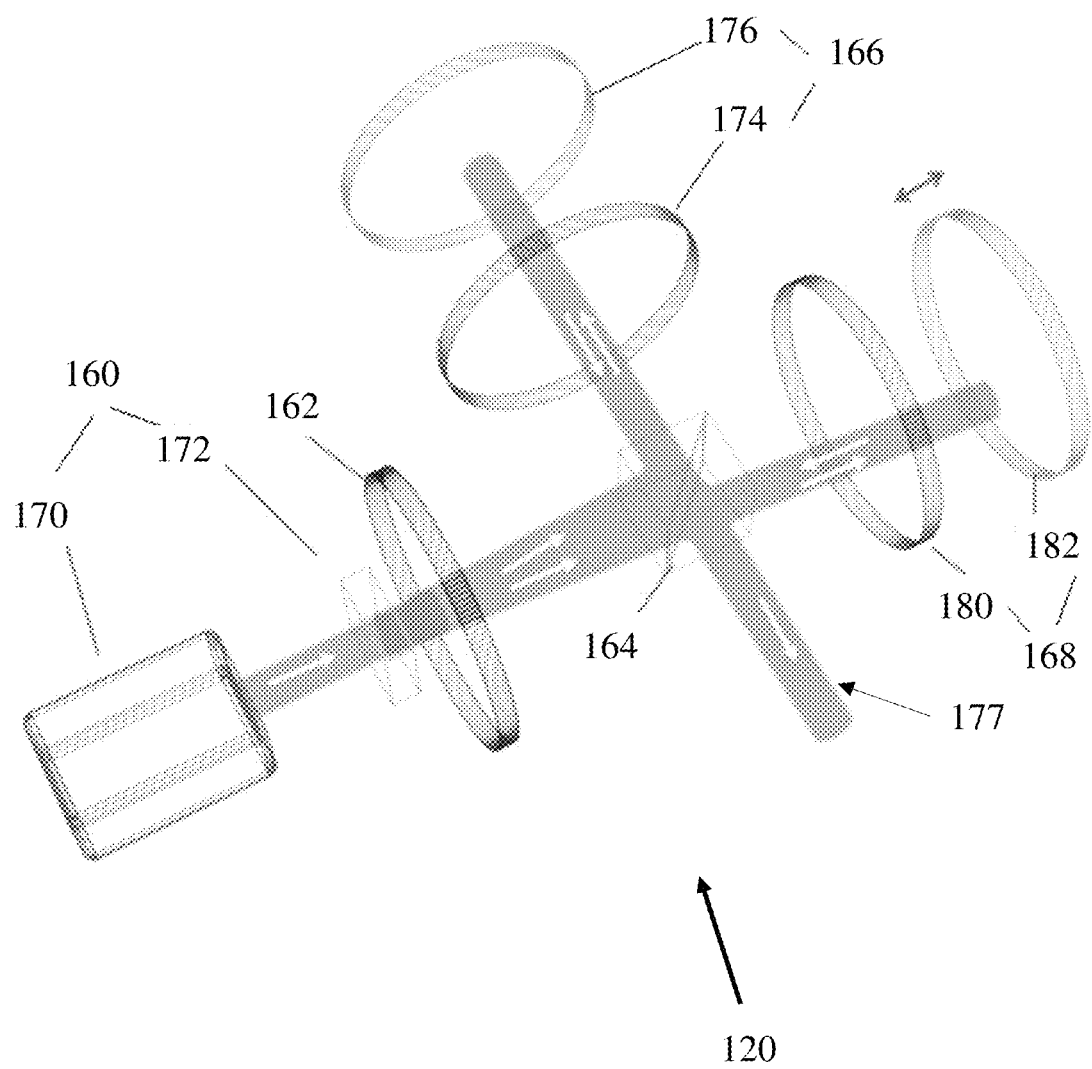
FIG. 2 illustrates a three-dimensional schematic diagram of an entangled state light source generator according to an embodiment of the invention.

FIG. 2 shows the internal structure of an entangled state light source generator 120 according to an embodiment of the invention, which can be applied to the entangled state light source generator in FIGS. 1a-1b. It should be noted that the structure as shown in FIG. 2 is not intended to be limiting, as entangled state light source generators used in displacement measurement systems according to embodiments of the invention could have other internal structures and components. The entangled state light source generator 120 includes an entangled photon pair generating section 160, a filtering section 162, a first polarization beam splitter 164, an angle adjusting section 166, and a time delay adjusting section 168. The entangled photon pair generating section 160 is adapted to generate baseline polarized photon pairs, and includes a continuous-light laser 170 and a BBO crystal 172. The continuous-light laser 170 is adapted to continuously emit linearly-polarized light, and the BBO crystal 172 is adapted to convert the linearly-polarized light into linearly-polarized photon pairs. The filtering section 162 is adapted to filter excitation light in baseline polarized photon pairs from the BBO crystal 172. The first polarization beam splitter 164 is adapted to reflect and project left-handed rotational photons and right-handed rotational photons in the baseline polarized photon pairs, respectively, to the angle adjusting section 166 and the time delay adjusting section 168.

The angle adjusting section 166 is adapted to adjust exit angle of the left-handed rotational light, and to reflect it to the polarizing beam splitter 164 so that the left-handed rotational light and the right-handed rotational light are emitted from the polarizing beam splitter 164 along the same way. The angular adjusting section 166 includes a first quarter-wave plate 174 and an angular reflector 176, which are disposed sequentially in the propagation path of the left-handed rotational photons.

The time delay adjusting section 168 is adapted to adjust the time delay of the right-handed rotational light to be reflected to the polarizing beam splitter 164, so that the left-handed rotational light and the right-handed rotational light are emitted from the polarizing beam splitter 164 at the same time. The time delay adjusting section 168 contains a second quarter-wave plate 180, a time-delay reflector 182 and a displacement stage (not shown). The time-delay reflector 182 is provided on the displacement stage, and the second quarter-wave blade 180 and the displacement stage are provided sequentially on the propagation path of the right-handed rotational photons. The time-delay reflector 182 includes an optical delay line (not shown).

Having described the internal structure of the entangled state light source generator 120, the working principle of the same will now be described. The generation of linearly-polarized photon pairs in the entangled state light source generator 120 starts with linearly-polarized excitation light emitted from the continuous-light laser 170 incident to the BBO crystal 172 under phase matching conditions, and then the BBO crystal 172 generates polarization-entangled photon pairs. The polarization-entangled photon pairs after passing through the filtering section 162 have the excitation light filtered out. Afterwards, the left-handed rotational light and the right-handed rotational light enter respectively the first quarter-wave plate 174 and the second quarter-wave plate 180, after the polarization-entangled photon pairs incident to the polarizing beam splitter 164. Both the first quarter-wave plate 174 and the second quarter-wave plate 180 are placed in positions where their optical axes are 45° from the direction of incident polarization. The first quarter-wave plate 174 cooperates with the angular reflector 176 and the second quarter-wave plate 180 cooperates with the angular reflector 182, such that the incident linearly-polarized light is turned 90° to allow photon pairs returning to the polarizing beam splitter 164 to exit from the remaining port 177. The purpose of the time-delay reflector 182 with the optical delay line is to fine-tune the time delay of the two photons in the pair to ensure that the two photons are ejected at the same time and to ensure that the ejected state is a two-photon entangled state. In order to realize a second-type phase matching, the tangent angle of the BBO crystal 172 is 41.7°. The outgoing point-like SPDC (spontaneous parametric down-conversion) photon pairs from the port 177 are angled, where one way of the photon pair requires the time-delay reflector 182 that provides a positive incidence delay to adjust the optical delay, and the other angular reflector 176 is adapted to correct the angle of the outgoing photons so that the outgoing photon pairs are outputted from the port 177 along the same way.

Figure 3A:
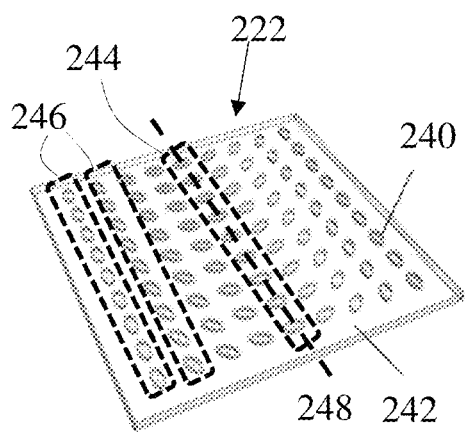
FIG. 3a is a perspective view of a meta-device element according to another embodiment of the invention.
Figure 3B:
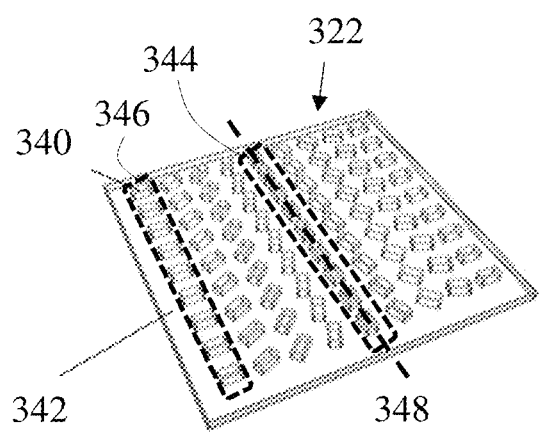
FIG. 3b is a perspective view of a meta-device element according to a further embodiment of the invention.

Turning to FIGS. 3a and 3b, which show exemplary meta-device elements according to two different embodiments of the invention. The meta-device elements in FIGS. 3a and 3b can both be applied in the displacement measurement system as shown in FIGS. 1a and 1b. It should be noted that the structures as shown in FIGS. 3a-3b are not intended to be limiting, as meta-device elements used in displacement measurement systems according to embodiments of the invention could have other internal structures, components, or their arrangement. The meta-device element 222 in FIG. 3a includes a substrate 242 and an array of meta-device units 240 (which in this embodiment are nanoantennas) disposed on the substrate 242. In order to realize a quantum meta-device element 222 for ultra-sensitive displacement metrology, dielectric materials such as gallium nitride, aluminum oxide and titanium oxide, which are compatible with current semiconductor processes and have high refractive indices and low losses in the visible and near-infrared bands, are used to fabricate the substrate 242. The purpose of selecting a material with the aforementioned properties is to provide the meta-device units 240 with the resonance required to produce a specific phase. As shown in FIG. 3a, each of the meta-device units 240 has an elliptical cylindrical shape, and its dimension is selected based on a desired operating wavelength.

The meta-device element 222 generates a phase delay required for a specific wavelength of light based on a designed resonance. For the meta-device element 222 used for ultra-sensitive displacement metrology, four or more of these meta-device elements 222 are grouped to form a meta-device unit bank. Each different meta-device unit 240 in a meta-device unit bank provides different phase delays for the light, which serves as a basis for realizing the function of the meta-device element 222 for ultra-sensitive displacement metrology. Taking the aforementioned meta-device units 240 as a basis, the meta-device units 240 are arranged according to a geometrical phase rule, i.e., for each small angle θ of rotation, a phase shift of 2θ can be brought to the corresponding circularly-polarized light to obtain a distribution of a meta-device unit.

As shown in FIG. 3a, all the meta-device units 240 in the array disposed on top of the substrate 242 are of the same shape and are uniformly distributed (i.e., being equidistant to each other). The array of meta-device units 240 of the meta-device element 222 contains a central column 244 which contains multiple (nine in the example shown in FIG. 3a) meta-device units 240 aligned along a direction of a virtual central axis 248 of the meta-device element 222. On two sides of the central column 244 there are also multiple side columns 246 (four on each side in the example shown in FIG. 3a) each of which contains the same number of meta-device units 240 as the central column 244.

In the central column 244, the meta-device units 240 all have the same orientations, and their elliptical cylindrical shapes are substantially perpendicular to the virtual central axis 248. The meta-device units 240 in the side columns 246 have their orientations forming angles with that of the meta-device units 240 in the central column 244. Within each side columns 246 all meta-device units 240 have the same orientation. In addition, meta-device units 240 in the side columns 246 as they are located farther and farther from the central column 244 have gradually increasing angles as formed with orientations of the meta-device units 240 in the central column 244. In the example shown in FIG. 3a, between every two adjacent columns (being it a side column 246 or the central column 244) the difference in the angles of the meta-device units 240 is the same, which is 22.5°. Meta-device units 240 in the side column 246 which is farthest from the central column 244 have their elliptical cylindrical shapes being substantially parallel to that of the central column 244) (0°), and the meta-device units 240 in the second farthest side column 246 have their elliptical cylindrical shapes forming an angle of 22.5° to that of the central column 244, and so on, with the constant difference of 22.5° between orientations of meta-device units 240 in any two adjacent columns. Note that the side columns 246 including orientations of meta-device units 240 therein are mirrored about the virtual central axis 248. The number of side columns 246 located on each side of the central column 244 is a period of the metasurface of the meta-device element 222, which is four (Λ=4) in the example shown in FIG. 3a.

The meta-device element 322 shown in FIG. 3b is generally similar to that in FIG. 3a, so common or similar features between the two meta-device elements will not be described again for the sake of brevity. The major difference between the meta-device element 3 and that in FIG. 3a is that the meta-device element 322 contains meta-device units 340 that are rectangular nanostructures which are disposed on a substrate 342. In addition, in the central row 344 the meta-device units 340 have their orientations substantially parallel to a virtual central axis 348. In contrast, in the farthest side row 346 the meta-device units 340 have their orientations substantially perpendicular to the virtual central axis 348.

Figure 4:
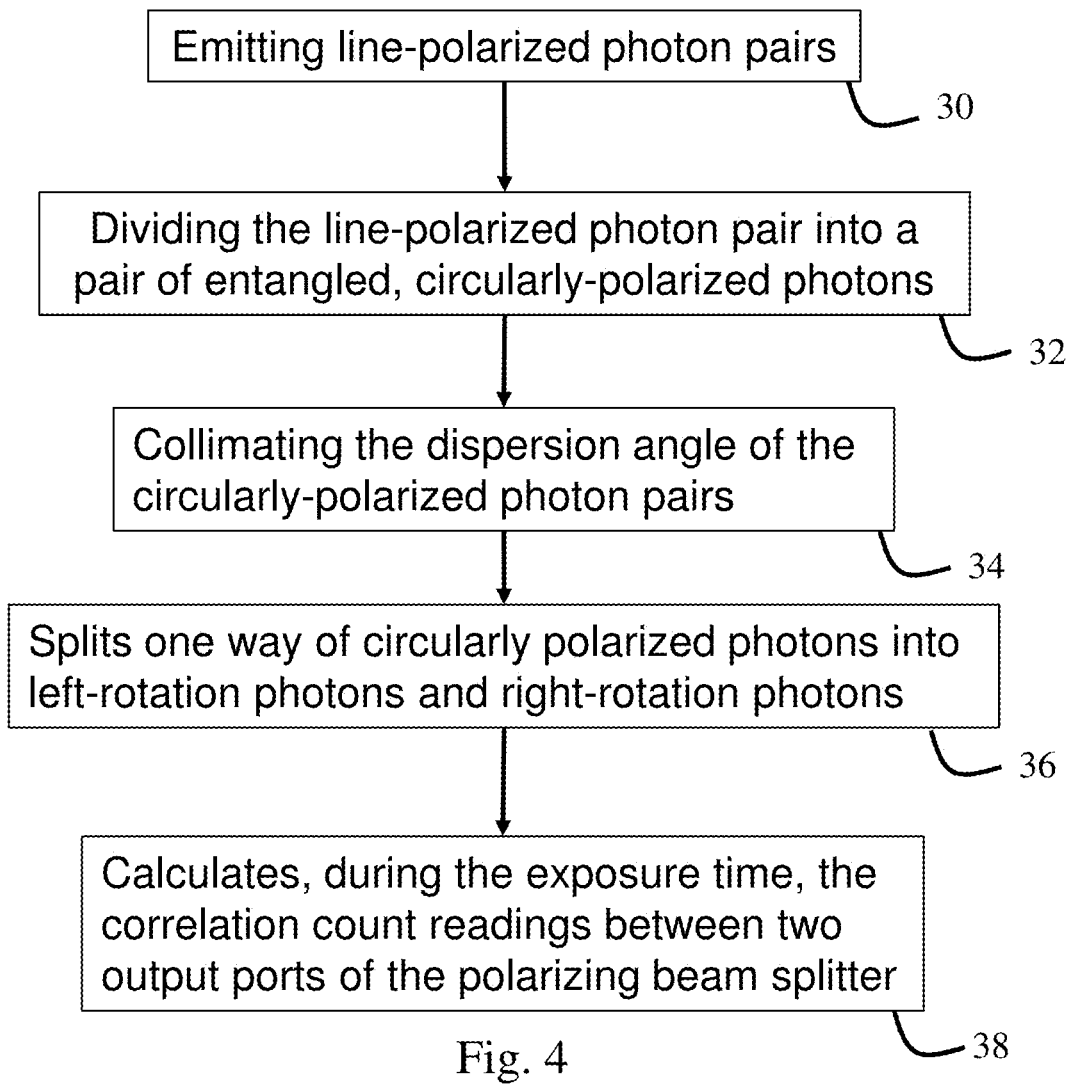
FIG. 4 is a flowchart showing the process of displacement measurement using the system of FIGS. 1a-1b.

Returning back to the embodiment shown in FIGS. 1a-1b. Having described the structure of the displacement measurement system and function of each component in the system, the working principle of the displacement measurement system will now be described. As described above, the displacement measurement system includes only the entangled state light source generator 20, the meta-device element 22, the collimating lens 24, the polarizing beam splitter 26, and the computing section 28, yet even a tiny displacement of the meta-device element 22 can be measured. For the displacement measurement system of FIGS. 1a and 1b, the measurement process in summary is shown in FIG. 4. The process starts with Step 30 in which the entangled state light source generator 20 emits linearly-polarized photon pairs 21 which are entangled photon pairs, and the entangled state light source generator 20 directs the linearly-polarized photon pairs 21 to impinge on the meta-device element 22. Then, in Step 32 a modulation function of the meta-device element 22 divides the linearly-polarized photon pair 21 into a pair of entangled, circularly-polarized photons 23 with a certain dispersion angle and in opposite rotational directions. The purpose of having the linearly-polarized photon pairs passing through the meta-device element 22, is to attach phase information derived from the displacement of the meta-device element 22 to the linearly-polarized photon pairs 21. The circularly-polarized photon pairs 23 emitted from the meta-device element 22 have the phase resulted from the displacement of the meta-device element 22.

In Step 34, the dispersion angle of the circularly-polarized photon pairs 23 is collimated by the collimating lens 24. Then, as mentioned above one way of the circularly polarized photons 23b goes to the polarization beam splitter 26, and the other one way of the circularly polarized photons 23a does not. In Step 36, the polarization beam splitter 26 splits the one way of circularly polarized photons 23b into left-handed rotational photons 27a and right-handed rotational photons 27b, which are then outputted to the computing section 28. In Step 38, the computing section 28 calculates, during the exposure time, the correlated count reading between two output ports (not shown) of the polarizing beam splitter 26 after all left-handed and right-handed rotational photons have been projected onto the polarizing beam splitter 26, in order to measure the displacement of the meta-device element 22.

In order to describe more clearly the role of the additional phase due to the small displacement of the meta-device element in the correlated output of the final polarization state, for convenience the role of the individual components of a meta-device element on the photonic state is defined and described in terms of the Jones matrix. In particular, define the substrate of the meta-device element as in a circularly-polarized state $|R\rangle |L\rangle$, the meta-device element denoted being as $$U_1 = \begin{pmatrix} 0 & e^{2i\theta_1} \\ e^{-2i\theta_1} & 0 \end{pmatrix},$$

the meta-device element along a reverse direction of incident light being denoted as $$U_2 = \begin{pmatrix} 0 & e^{-2i\theta_2} \\ e^{2i\theta_2} & 0 \end{pmatrix},$$

a reflector lens under circular polarization being denoted as $$U_{R,RoL} = \begin{pmatrix} 0 & -1 \\ -1 & 0 \end{pmatrix},$$

a transformation matrix from circularly-polarization base to linearly-polarization base being denoted as $$U = \frac{1}{\sqrt{2}} \begin{pmatrix} 1 & 1 \\ -i & i \end{pmatrix},$$

and the incident state φ being defined as $$\varphi = (1/(\sqrt{(c_1^2 + c_2^2)})) \begin{pmatrix} c_1 \\ c_2 \end{pmatrix},$$

then the overall output photon state of the meta-device element can be expressed as $$\Phi = UU_2 U_{R,RoL} U_1 U^\dagger \varphi$$

In embodiments of the invention, the introduction of multiphoton-entangled NOON state makes it possible to reach the Heisenberg limit, i.e., enhancing the sensitivity of the phase by a factor of N with the participation of N photon states, i.e., $U_p(\varphi)|N\rangle = e^{iN\varphi}|N\rangle$. For classical photon states, the above expressions hold, but for N-photon state, the above expressions will change at $U_1$ and $U_2$. Taking $U_1$ as an example, $$U_1 = \begin{pmatrix} 0 & e^{2i\theta_1} \\ e^{-2i\theta_1} & 0 \end{pmatrix} \rightarrow U_1 = \begin{pmatrix} 0 & e^{2iN\theta_1} \\ e^{-2iN\theta_1} & 0 \end{pmatrix}.$$

In the embodiment shown in FIGS. 1a-1b, a single photon enters the computing section 28, so N=1. The single photon does not entangle with any other photon, and the single photon may become either a left-handed rotational photon or a right-handed rotational photon, with a 50% chance for each case.

With the photonic states defined above, the measurement process of the displacement of the meta-device element 22 as shown in FIG. 4 will be described again. Initially, in Step 30 the entangled state light source generator 20 simultaneously outputs photons that are horizontally-polarized photons $|1\rangle_H$ and vertically-polarized photons $|1\rangle_V$, which are impinged on the meta-device element 22. The meta-device element 22 in Step 32 converts the entangled photon pairs $|1\rangle_H$ and $$|1\rangle_V \text{ to } \frac{i}{\sqrt{2}}(|2\rangle_R |0\rangle_L - |0\rangle_R |2\rangle_L),$$

which leads to the generation of multiphoton states. If no displacement of the meta-device element 22 occurs, the separated right-handed and left-handed rotational light will return as they are, and the output of the computing section 28 will be $|1\rangle_H |1\rangle_V$. When a small displacement occurs, the incoming entangled photon state $|1\rangle_H |1\rangle_V$ to the meta-device element 22 will come with a displacement-dependent additional phase, and the additional phase will result in a change in the output polarization state from the computing section 28. The specific change in intensity of the polarization state as a result of the small displacement is described in the following section.

The role of the meta-device element 22 can be equated to that of a beam splitter for circular polarization, i.e., the phase distribution is a gradient phase and the phase distribution varies spatially in a discrete manner. The meta-device element 22 is composed of a series of meta-device units (e.g. nanoantennas as described above) with varying spatial optical axes, where the angular distribution of the optical axes is distributed with the spatial position, denoted as θ(x). Circularly-polarized light passing through the meta-device element 22 receives an additional phase factor $e^{-2i\theta(x)}$. When the meta-device element 22 is moved laterally by a displacement, the additional phase for circular polarization is shifted by a corresponding distance. Introducing a tiny displacement δx by the meta-device element 22, the additional phase can be expressed as $$\theta_2(x) = \theta_1(x + \delta x) = \frac{\pi}{\Lambda}\delta x,$$

where Λ is the period of the metasurface of the meta-device element 22. The additional phase induced by this tiny displacement δx will be reflected in the correlated output of the final polarized state from the computing section 28.

As mentioned, in the embodiments of FIGS. 1a-1b, a number of time windows are included within the exposure time. Within each time window it is possible to collect left-handed rotational photons 27a, right-handed rotational photons 27b, or both. As in this embodiment there is only one single photon counted in the computing section 28, the correlation count reading is thus imported into the following equation to obtain displacement of the meta-device element 22.

$$P(\delta x) = P_0 \sin\left[\frac{2\pi \delta x}{\Lambda}\right]$$

wherein P(δx) is the correlation count reading under the current displacement of the meta-device element 22, $P_0$ is the hyperparameter, Sin is the sinusoidal function, 2π/Λ is the sensitivity, Λ is the period, which is four in the example, and δx is the displacement of the meta-device element 22.

Figure 5:
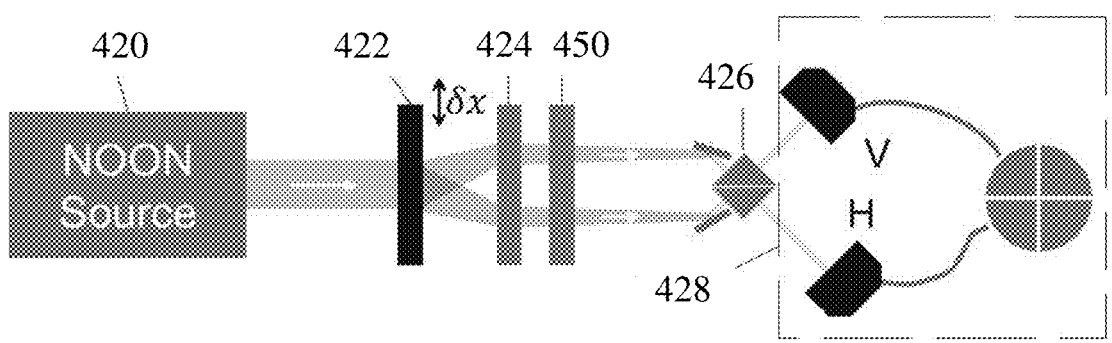
FIG. 5 is a two-dimensional schematic diagram of a displacement measurement system for a quantum meta-device element according to a further embodiment of the invention.

Turning now to FIG. 5 which shows another embodiment of the invention which is a displacement measurement system for a quantum meta-device element. The system contains an entangled state light source generator 420, a meta-device element 422, a collimating lens 424, a polarizing beam splitter 426, and a computing section 428. For the sake of brevity, functions of these components and the internal structure as well as working principle of the system of FIG. 4 which are identical or similar to those in the system of FIGS. 1a-1b will not be described here again. Compared to the system in FIGS. 1a-1b, the system in FIG. 4 contains an additional component which is a photon converging section 450 which is located after the meta-device element 422 in a direction of propagation of the linearly-polarized photon pairs outputted from the entangled state light source generator 420. To enhance the resolution of the displacement measurement system, the photon converging section 450 is included which is to converge individual photons into photon pairs and sent to the polarization beam splitter 426. The photon converging section 450 is provided in the propagation path of the circularly-polarized photon pairs, which transforms the circular-polarized photon pairs (including photons in both ways) into further linearly-polarized photon pairs, and emits them to the polarizing beam splitter 426. The further linearly-polarized photon pairs as they are converted from the circularly-polarized photon pairs are not the same linearly-polarized photon pairs outputted from the entangled state light source generator 420. The further linearly-polarized photon pairs continue to propagate along the direction of propagation, and to the polarizing beam splitter 426. The polarizing beam splitter 426 then splits the circularly-polarized photons into left-handed rotational photons and right-handed rotational photons, which are supplied to the computing section 428. Note that unlike the embodiment of FIGS. 1a-1b, the polarizing beam splitter 426 processes both ways of the circularly-polarized photons.

By the configuration of the system of FIG. 4, the light intensity can be boosted, and displacement of the meta-device element 422 is obtained by importing the correlation count reading into the following formula when calculations are performed by the computing section 428. The result is that the sensitivity of the system is changed, and more specifically the sensitivity of the current displacement measurement system is improved to two times of that when no photon converging section is present, thereby obtaining the displacement of the meta-device element 422.

$$P(\delta x) = P_0 \mathrm{Sin}\left[\frac{4\pi \delta x}{\Lambda}\right]$$

wherein $P(\delta x)$ is the correlation count reading under the current displacement of the meta-device element 422, $P_0$ is the hyperparameter, Sin is the sinusoidal function, $4\pi/\Lambda$ is the sensitivity, $\Lambda$ is the period, and $\delta x$ is the displacement of the meta-device element 422.

In some other embodiments of the invention, in order to enhance the resolution of the displacement measurement system, the phase generated by the displacement of the meta-device element can be applied to a photon pair multiple times. In some scenarios, the photon pair can be made to pass through two different meta-device elements that have same displacement consecutively in order to increase the phase. In particular, if the photon pair passes through two meta-device elements with phases defined as $\theta_1(x)$ and $\theta_2(x)$ respectively, then for the left-handed polarized light, the outgoing phase as added can be represented by $LCP \rightarrow RCPe^{2i\theta_1(x)} \rightarrow LCPe^{-2i\theta_2(x)}e^{2i\theta_1(x)}$. For the right-handed polarized light, the outgoing phase as added can be represented by $RCP \rightarrow LCPe^{-2i\theta_1(x)} \rightarrow RCPe^{2i\theta_2(x)}e^{-2i\theta_1(x)}$. To further reduce the system size and increase the resolution, in some embodiments of the invention the phase resulted from displacement can be increased several times by reflection, and the number of meta-device elements can be reduced from two to one if the output circularly-polarized light is reflected back to the meta-device element by using mirrors. Moreover, circularly-polarized photon pairs can be modulated and co-emitted into the polarizing beam splitter to enhance the light intensity and increase the resolution.

In particular, in one embodiment of the invention, in order to enhance the resolution of the displacement measurement system further, the circularly-polarized photon pairs can be modulated and then reflected, and the reflected circularly-polarized photon pairs can be repeatedly modulated and converted to linearly-polarized photon pairs by passing through the meta-device element one more time, and be attached with the phase generated by the displacement of the meta-device element again. Then, the linearly-polarized photon pairs appended with twice the phase resulted from displacement can be emitted into the polarizing beam splitter, so that the light intensity is enhanced and the resolution is increased again.

Figure 6:
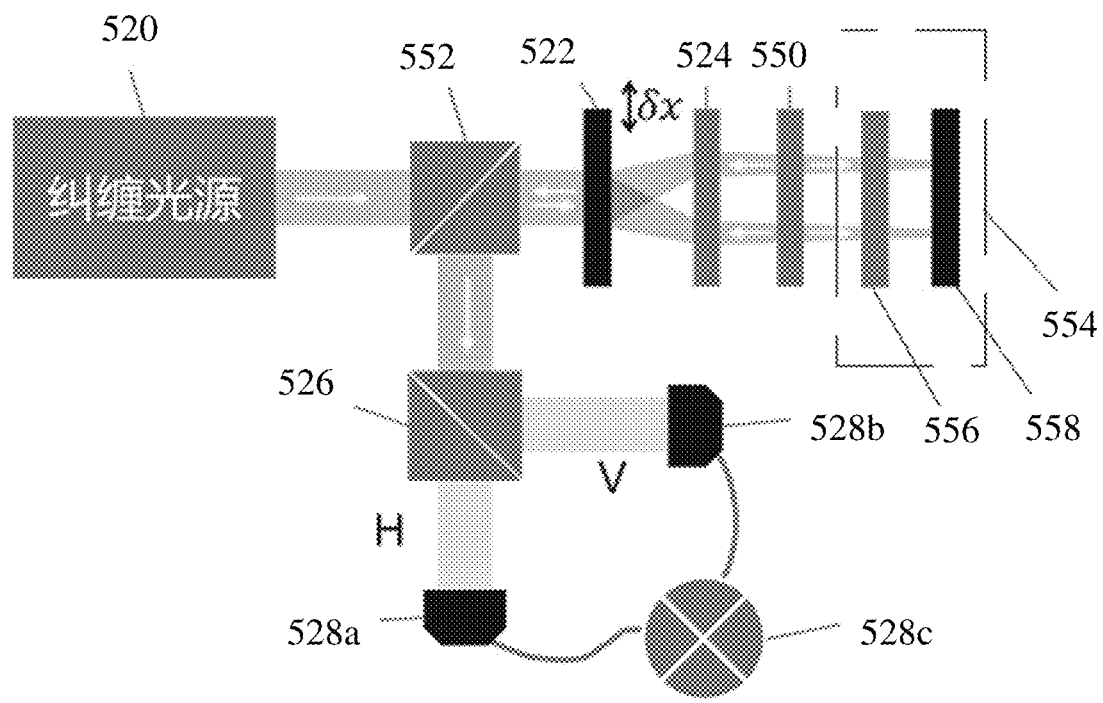
FIG. 6 is a two-dimensional schematic diagram of a displacement measurement system for a quantum meta-device element according to a further embodiment of the invention.

FIG. 6 shows a displacement measurement system for a quantum meta-device element incorporating the above working principle. The system contains an entangled state light source generator 520, a meta-device element 522, a collimating lens 524, a photon converging section 550, a polarizing beam splitter 526, and a computing section 528. The computing section 528 includes a first single photon detector 528a, a second single photon detector 528b and a correlation counter 528c. For the sake of brevity, functions of these components and the internal structure as well as working principle of the system that are identical or similar to those in the systems of FIGS. 1a-1b and FIG. 5 will not be described here again. Compared to the systems in previously described embodiments, the system in FIG. 6 contains additional components which are a beam splitter mirror 552 and a reflection section 554. The beam splitter mirror 552 is provided in the direction of propagation of linearly-polarized photon pairs emitted by the entangled state light source generator 520, and the beam splitter mirror 552 is adapted to transmit linearly-polarized photon pairs generated by the entangled state light source generator 520 to the meta-device element 522. The polarizing beam splitter 526 and the computing section 528 are arranged in the reflection path of the beam splitter mirror 552.

The reflection section 554 is provided in the propagation path of the linearly-polarized photon pairs emitted by the polarizing beam splitter 526. As with functions of similar components as mentioned above, the meta-device element 522 is adapted to modulate the linearly-polarized photon pairs into circularly-polarized photon pairs with attached phase due to displacement of the meta-device element 522. The reflection section 554 is adapted to receive the linearly-polarized photon pairs that have passed sequentially through the meta-device element 522, the collimating lens 524, the photon converging section 550, and to reflect them to the photon converging section 550. As shown in FIG. 6, the reflection section 554 contains a spatial filter 556 and a reflector 558. The spatial filter 556 is adapted to filter interference signals in the linearly-polarized photon pair, where the reflector 558 is adapted to reflect the linearly-polarized photon pair through the spatial filter 556 to the photon converging section 550. Note that unlike the embodiment of FIGS. 1*a*-1*b*, the both ways of the circularly-polarized photons as outputted by the collimating lens 524 are processed by the photon converging section 550 and the reflection section 554.

The photon converging section 550 is adapted to convert linearly-polarized photon pairs into circularly-polarized photon pairs, and to emit them through the collimating lens 3 back to the meta-device element 522. The meta-device element 522 is adapted to modulate the circularly-polarized photon pair received along the reflection path, into a linearly-polarized photon pair, so that it is again attached with a phase resulted from the displacement of the meta-device element 522. The linearly-polarized photon pair with the two phase added is then emitted to the beam splitter mirror 552. The beam splitter mirror 552 is adapted to reflect the linearly-polarized photon pair with the additional phase to the polarizing beam splitter 526.

With the above configuration, quantum interference effect can be utilized to obtain the displacement of the meta-device element 522 by importing the correlated count reading into the following equation when calculations are performed by the computing section 528, so as to increase the sensitivity of the displacement measurement system.

$$P(\delta x) = P_0 \mathrm{Sin}\left[\frac{8\pi\delta x}{\Lambda}\right]$$

wherein $P(\delta x)$ is the correlation count reading under the current displacement of the meta-device element 522, $P_0$ is the hyperparameter, Sin is the sinusoidal function, $8\pi/\Lambda$ is the sensitivity, $\Lambda$ is the period, and $\delta x$ is the displacement of the meta-device element 522. Compared to the embodiment shown in FIGS. 1*a*-1*b*, the sensitivity of the system in FIG. 6 can be improved by a factor of four, and compared to the embodiment shown in FIG. 5, the sensitivity of the system in FIG. 6 can be improved by a factor of two.

Figure 7:
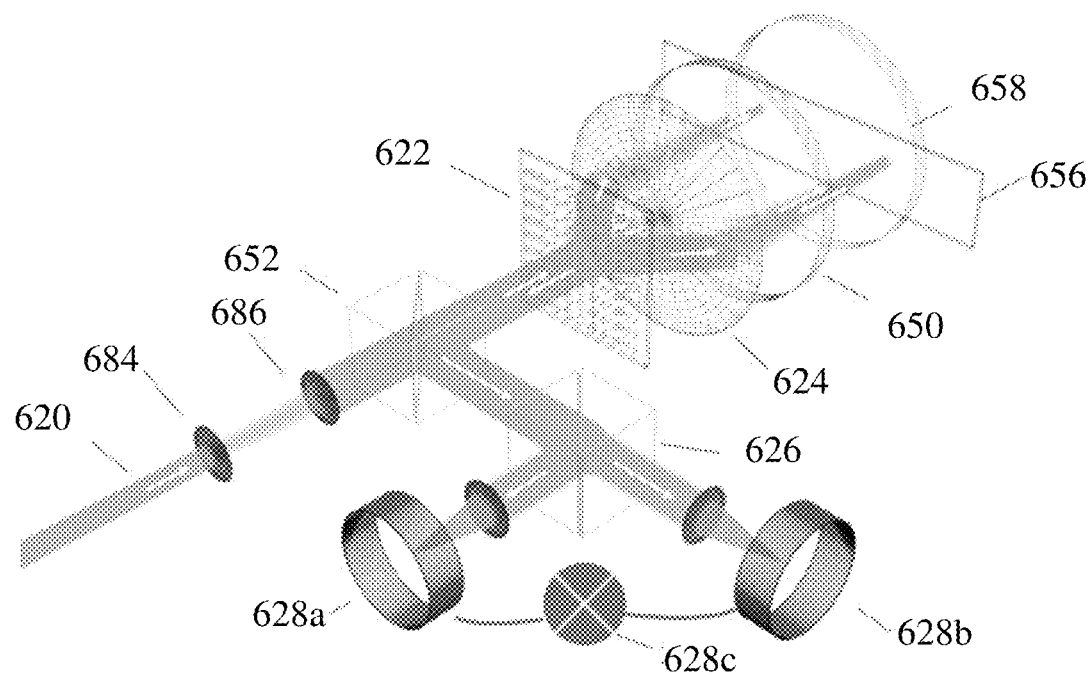
FIG. 7 is a three-dimensional schematic diagram of a displacement measurement system for a quantum meta-device element according to a further embodiment of the invention.

According to some other embodiments of the invention, in order to make the structure of the displacement measurement system even more lightweight, the collimating lens can be omitted to avoid the structure of the displacement measurement system being too redundant. Alternatively or additionally, in scenarios where the collimation requirements are higher, a collimating section may be provided between the entangled state light source generator and the beam splitter mirror. FIG. 7 illustrates a displacement measurement system according to a further embodiment of the invention. The system contains an entangled state light source generator 620, a meta-device element 622, a collimating lens 624, a photon converging section 650, a polarizing beam splitter 626, and a computing section 628, a beam splitter mirror 652 and a reflection section that contains a spatial filter 656 and a reflector 658. The computing section 628 includes a first single photon detector 628*a*, a second single photon detector 628*b* and a correlation counter 628*c*. For the sake of brevity, functions of these components and the internal structure as well as working principle of the system that are identical or similar to those in the systems of FIGS. 1*a*-1*b*, 5 and 6 will not be described here again. Compared to the systems in previously described embodiments, the system in FIG. 7 contains additional components which are a flat-concave lens 684 and a flat-convex lens 686. In one exemplary implementation, the flat-concave lens 684 has a focal length of −5 cm, and the flat-convex lens 686 has a focal length of 7.5 cm. The combination of the flat-concave lens 684 and the flat-convex lens 686 is a beam collimation system, which is used to correct the laser divergence angle after the light source output. Slightly adjusting the distance between the two can adjust the collimation of the outgoing beam, and then the collimated beam will enter the meta-device.

One can see that various exemplary embodiments described above provide displacement measurement systems for measuring displacement of a quantum meta-device element. A computing section in the displacement measurement system determines a correlated count reading within a exposure time, and obtains the displacement of the meta-device element by importing the correlated count reading into the general formula below.

$$P(\delta x) = P_0 \mathrm{Sin}\left[\frac{L\pi\delta x}{\Lambda}\right]$$

wherein $P(\delta x)$ is the correlation count reading under the current displacement of the meta-device element, $P_0$ is the hyperparameter, Sin is the sinusoidal function, $L\pi/\Lambda$ is the sensitivity, and $\Lambda$ is the period. L can be determined according to the light intensity, for example L could be 2, 4 or 8. $\delta x$ is the displacement of the meta-device element.

The quantum meta-device elements for ultrasensitive displacement measurement as provided in various exemplary embodiments therefore enable fine displacement measurement by using the measurement systems. Taking advantage of the fact that the metasurface is adapted to accurately manipulate the phase and polarization of the incident light, the quantum meta-device element for ultrasensitive displacement measurement based on the principle of beam splitting of circularly-polarized light is able to precisely regulate the output of a pair of circularly-polarized photons. On the other hand, by making use of the principle of quantum superposition state, the NOON state is prepared by the quantum light source to realize the input in multiphoton entangled state. After the light passes through the quantum meta-device element, the Heisenberg measurement limit, which is far below the classical measurement limit, can be realized. The quantum meta-device element for ultrasensitive displacement measurement can be used for displacement measurement applications that require highly sensitive measurements, such as high-precision displacement stages, high-precision semiconductor processing such as electron beam exposure and deep-ultraviolet exposure, and high-precision measurements of fundamental physical quantities such as gravitational constants, among other practical application scenarios.

The invention further provides a EUV lithography machine that contains a displacement measurement system according to embodiments of the invention. As those skilled in the art would understands, EUV is an optical lithography technology used in semiconductor device fabrication to make integrated circuits (ICs), and generally speaking main modules of a EUV lithography machine are the illumination system and the projection optics. The illumination system is responsible for generating the EUV light, which is then directed onto the mask. The projection optics, on the other hand, are responsible for projecting the image of the mask onto the wafer. A EUV lithography machine also contain a displacement measurement system. For example, in some EUV lithography machines the stage moves two wafer tables simultaneously, each holding a silicon wafer. While one wafer is being exposed, the position of the other wafer is measured by the machine's displacement measurement system which is crucial for maintaining the high precision required in semiconductor device fabrication.

The exemplary embodiments are thus fully described. Although the description referred to particular embodiments, it will be clear to one skilled in the art that the invention may be practiced with variation of these specific details. Hence this invention should not be construed as limited to the embodiments set forth herein.

While the embodiments have been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

For example, a person of ordinary skill in the art may realize that certain module(s) (for example the computing section) and method steps of the various examples described in connection with the embodiments disclosed herein may be realized by electronic hardware, computer software, or a combination of both, and in order to clearly illustrate the interchangeability of the hardware and the software, the module(s) and the steps of the various examples have been described in the foregoing description in general terms according to the functions. Whether these functions are performed in hardware or software depends on the particular application and design constraints of the technical solution. The skilled person may use different methods for each particular application to implement the described functions, but such implementations should not be considered outside the scope of the invention.

The functional units and modules that involve computations in accordance with the embodiments disclosed herein may be implemented using computing devices, computer processors, or electronic circuitries including but not limited to application-specific integrated circuits (ASIC), field programmable gate arrays (FPGA), and other programmable logic devices configured or programmed according to the teachings of the present disclosure. Computer instructions or software codes running in the computing devices, computer processors, or programmable logic devices can readily be prepared by practitioners skilled in the software or electronic art based on the teachings of the present disclosure.

The embodiments include computer storage media, transient and non-transient memory devices having computer instructions or software codes stored therein which can be used to program computers or microprocessors to perform any of the processes of the present invention. The storage media, transient and non-transitory computer-readable storage medium can include but are not limited to floppy disks, optical discs, Blu-ray Disc, DVD, CD-ROMs, magneto-optical disks, ROMs, RAMs, flash memory devices, or any type of media or devices suitable for storing instructions, codes, and/or data.

In the exemplary embodiments described above, it should be understood that the systems, devices and methods as disclosed may be realized in other ways. For example, the separation between internal components that are described above is merely a logical function separation, and in actual implementations the components may be separated in other ways, e.g., a plurality of units or components may be combined or may be integrated into another system, or some features may be ignored, or not implemented. Furthermore, coupling or direct coupling or communication connection between the units or components shown or discussed may also be indirect coupling or communication connection through some interface, device or unit, or may be connected electrically, mechanically or in some other form.

What is claimed is:
1. A displacement measurement system, comprising:
 a) an entangled state light source generator adapted to emit a linearly-polarized photon pair; the linearly-polarized photon pair being an entangled photon pair;
 b) a meta-device element adapted to receive the linearly-polarized photon pair and converts the same to a circularly-polarized photon pair;
 c) a first polarization beam splitter adapted to split one or both ways of the circularly-polarized photon pair into a left-handed rotational photon and a right-handed rotational photon, and to output the left-handed rotational photon and the right-handed rotational photon via a first port and a second port of the first polarization beam splitter respectively; and
 d) a computing section adapted to compute a correlated count reading between the first and second ports of the first polarization beam splitter, and to determine a displacement of the meta-device element.

2. The displacement measurement system of claim 1, further comprises a collimating lens positioned, in a direction of propagation of the linearly-polarized photon pair, after the meta-device element; the collimating lens adapted to collimate the circularly-polarized photon pair.

3. The displacement measurement system of claim 1, wherein the computing section further comprises a first single photon detector, a second single photon detector, and a correlation counter; the first single photon detector adapted to receive the left-handed rotational photon from the first port of the first polarization beam splitter; the second single photon detector adapted to receive the right-handed rotational photon from the second port of the first polarization beam splitter; the correlation counter adapted to compute the correlated count reading between the first and second ports of the first polarization beam splitter.

4. The displacement measurement system of claim 1, further comprises a photon converging section positioned, in a direction of propagation of the linearly-polarized photon pair, after the meta-device element; the photon converging section adapted to converge individual photons into photon pairs.

5. The displacement measurement system of claim 4, wherein the photon converging section is further adapted to convert the circularly-polarized photon pair to a further linearly-polarized photon pair.

6. The displacement measurement system of claim 5, further comprises a reflection section positioned, in a direction of propagation of the further linearly-polarized photon pair, after the photon converging section; the reflection section adapted to reflect the further linearly-polarized photon pair along a direction of reflection to the photon converging section and in turn to the meta-device element.

7. The displacement measurement system of claim 6, wherein the reflection section further comprises a spatial filter adapted to filter interference signals in the further linearly-polarized photon pair.

8. The displacement measurement system of claim 6, further comprises a beam splitter mirror positioned between the entangled state light source generator and the meta-device element; the beam splitter mirror adapted to transmit the linearly-polarized photon pair generated by the entangled state light source generator to the meta-device element, and also to reflect the further linearly-polarized photon pair received from the meta-device element to the first polarizing beam splitter.

9. The displacement measurement system of claim 6, wherein the entangled state light source generator comprises a continuous-light laser, an entangled photon pair converter, and a second polarizing beam splitter; the entangled photon pair converter adapted to convert a linearly-polarized light received from the continuous-light laser into the linearly-polarized photon pair; the second polarizing beam splitter adapted to reflect and project a left-handed rotational photon and a right-handed rotational photon in the linearly-polarized photon pair.

10. The displacement measurement system of claim 9, wherein the entangled photon pair converter is a BBO (beta-$BaB_2O_4$) crystal.

11. The displacement measurement system of claim 9, wherein the entangled state light source generator further comprises an angle adjusting section which is adapted to adjust an exit angle of left-handed rotational light outputted from the entangled photon pair converter, and to reflect it to the second polarizing beam splitter.

12. The displacement measurement system of claim 9, wherein the entangled state light source generator further comprises a time delay adjusting section which is adapted to adjust a time delay of right-handed rotational light outputted from the entangled photon pair converter, and to reflect it to the second polarizing beam splitter.

13. A method of conducting a displacement measurement, comprising the step of:
   a) generating continuously a plurality of linearly-polarized photon pairs;
   b) converting, using a meta-device element, one of the plurality of linearly-polarized photon pairs to a circularly-polarized photon pair;
   c) attaching a phase to the circularly-polarized photon pair; the phase derived from a displacement of the meta-device element;
   d) splitting one or both ways of the circularly-polarized photon pair into a left-handed rotational photon and a right-handed rotational photon;
   e) outputting the left-handed rotational photon and the right-handed rotational photon via a first port and a second port of a polarization beam splitter respectively; and
   f) computing a correlated count reading between the first and second ports of the polarization beam splitter in order to determine the displacement of the meta-device element.

14. The method of claim 13, further comprises a step of collimating the circularly-polarized photon pair before Step d).

15. The method of claim 13, further comprises a step of converging a plurality of individual protons obtained from Step d) into photon pairs.

16. The method of claim 13, further comprises a step of converting the circularly-polarized photon pair to a further linearly-polarized photon pair.

17. The method of claim 16, further comprises a step of reflecting the further linearly-polarized photon pair back to the meta-device element so that an additional phase is attached to the further linearly-polarized photon pair.

18. The method of claim 13, wherein Step f) further comprises:
   a) receiving the left-handed rotational photon by a first single photon detector of the computing section;
   b) in response to the left-handed rotational photon being received, generating a first high voltage level and sending it to a correlation counter of the computing section;
   c) receiving the right-handed rotational photon by a second single photon detector of the computing section;
   d) in response to the right-handed rotational photon being received, generating a second high voltage level and sending it to the correlation counter; and
   e) incrementing the correlation counter by one if both the first and second high voltage levels were received in a same time window.

19. The method of claim 18, further comprises the step of determining the displacement of the meta-device element based on a correlated count reading by the correlation counter after an exposure time has passed; the exposure time comprising multiple said time windows.

* * * * *